United States Patent
Nishijima et al.

(10) Patent No.: US 7,314,905 B2
(45) Date of Patent: Jan. 1, 2008

(54) DRAWN FILM AND PROCESS FOR PRODUCING THE SAME

(75) Inventors: Shigetoshi Nishijima, Sodegaura (JP); Shinichi Imuta, Sodegaura (JP); Toshiyuki Hirose, Sodegaura (JP)

(73) Assignee: Mitsui Chemicals, Inc., Tokyo (JP)

( * ) Notice: Subject to any disclaimer, the term of this patent is extended or adjusted under 35 U.S.C. 154(b) by 0 days.

(21) Appl. No.: 10/521,189

(22) PCT Filed: Mar. 26, 2004

(86) PCT No.: PCT/JP2004/004290

§ 371 (c)(1), (2), (4) Date: Jan. 14, 2005

(87) PCT Pub. No.: WO2004/087401

PCT Pub. Date: Oct. 14, 2004

(65) Prior Publication Data

US 2006/0105190 A1    May 18, 2006

(30) Foreign Application Priority Data

Mar. 28, 2003 (JP) .............................. 2003-092796

(51) Int. Cl.
  *C08F 10/14* (2006.01)
  *B32B 27/32* (2006.01)
  *B32B 11/08* (2006.01)
  *B65B 33/00* (2006.01)

(52) U.S. Cl. ............................... 526/348.1; 526/348.4; 428/516; 428/523; 428/910; 427/154; 264/291

(58) Field of Classification Search ................ 428/500, 428/523, 516, 910; 156/247, 254, 344; 427/155, 427/154; 526/348.1, 348.4; 264/291

See application file for complete search history.

(56) References Cited

U.S. PATENT DOCUMENTS 5,919,547 A * 7/1999 Kocher et al. .............. 428/138

FOREIGN PATENT DOCUMENTS

| EP | 01967729 | * | 9/2001 |
| EP | 1264685 A | * | 12/2002 |
| JP | 59078850 A | * | 5/1984 |
| JP | 60-206620 A | | 10/1985 |
| JP | 03073588 A | * | 8/1989 |
| JP | 02238911 A | * | 9/1990 |
| JP | 9-234786 A | | 9/1997 |
| JP | 2001-9890 A | | 1/2001 |
| JP | 2002-192673 A | | 7/2002 |
| JP | 2002-225207 A | | 8/2002 |

OTHER PUBLICATIONS

English Abstract, JP 06-134948 published May 17, 1994.
English Abstract, JP 03-073588 published Mar. 28, 1991.
English Abstract, JP 2002-225207 published Aug. 14, 2002.
English Abstract, JP 2003-001772 published Jan. 8, 2003.

* cited by examiner

*Primary Examiner*—Kevin R. Kruer
(74) *Attorney, Agent, or Firm*—Buchanan Ingersoll & Rooney PC

(57) ABSTRACT

A film that has high rigidity and high heat resistance and good releasability from a roughened copper foil surface, which is subjected to surface oxidization or etching treatment with acid, such as a black oxidized copper foil surface and that is suitable as a release film for producing an MLB; and a process for producing the same. A drawn film having a layer (A) which comprises a copolymer that is made from 4-methyl-1-pentene and ethylene or an α-olefin, except 4-methyl-1-pentene, having 3 to 20 carbon atoms and that comprises 80% or more by mole of 4-methyl-1-pentene, the thermal coefficient of contraction of the film being 20% or more in the film-drawn direction, or the peel area of the film being 50% or more when the film, together with a copper foil surface subjected to roughening treatment, is subjected to heating and pressing treatment. This film is suitable for producing an MLB and has good releasability from the roughened copper foil surface, for example, a black oxidized copper foil surface.

4 Claims, No Drawings

US 7,314,905 B2

DRAWN FILM AND PROCESS FOR PRODUCING THE SAME

The present application is the U.S. National Stage of International Application No. PCT/JP04/04290, filed Mar. 26, 2004, and claims priority of Japanese Application No. 2003-092796, filed Mar. 28, 2003.

TECHNICAL FIELD

The present invention relates to a highly heat-resistant film excellent in releasability and a process for producing the same, more specifically, a 4-methyl-1-pentene copolymer film which is made from 4-methyl-1-pentene and ethylene or an α-olefin having 3 to 20 carbon atoms and is useful as a release film, and a process for producing the same.

BACKGROUND ART

As the integration degree of IC's increases with a rapid progress in electronic equipment, printed wiring boards have widely been used in recent years to meet requirements such as further enhancement in precision, density, and reliability. The printed wiring boards are classified into a single-sided printed wiring board, a double-sided printed wiring board, a multi-layer printed wiring board, and a flexible printed wiring board. In particular, fields to which the multi-layer printed wiring board (hereinafter referred to as the "MLB"), wherein insulating layers are interposed between three or more electric conductor layers to integrate them, can be applied are extending since connection can be attained between any two of the conductor layers and between any one of the conductor layers and an electronic component to be mounted.

This MLB is formed by stacking one or more inner layer circuit plates and pre-pregs (made of epoxy resin or the like) alternately inside a pair of single-sided copper clad laminates or a pair of double-sided copper clad laminates as both-side exteriors, hot-pressing the resultant lamination, through cushion materials, by means of hot-pressing plates while nipping the lamination with a tool, so as to cure the pre-pregs and form an intensely-integrated lamination, making holes, subjecting the lamination to through-hole plating or the like, and etching the surfaces.

When such an MLB is produced, a release film is usually used between each of the copper clad laminates (exterior plates) and the tool. As this release film, a highly heat-resistant resin is used which is not melted in the heating and pressing step and is made of 4-methyl-1-pentene copolymer, polytetrafluoroethylene, acetate, polyester, polypropylene or some other polymer.

As the copper foil of the copper clad laminate, a copper foil having roughened surfaces is frequently used in order to heighten the adhesiveness between one of the surfaces and the epoxy resin. An example of this copper foil is the so-called black oxidized copper foil, which has surfaces roughened by oxidizing the surfaces or etching the surfaces with acid. In this case, the above-mentioned release film has a problem that the other of the copper foil surfaces gets into the surface of the film in the heating and pressing step because of insufficient rigidity of the film so that the film cannot be peeled.

Japanese Patent Application Laid-Open (JP-A) No. 3-73588 suggests that a film wherein a 4-methyl-1-pentene copolymer film is monoaxially drawn to improve the rigidity of the copolymer film is used as a release film. However, the 4-methyl-1-pentene copolymer film is insufficient in productivity and the draw ratio which can be attained, and also has problems about the external appearance of the film and the releasability thereof from a roughened surface of the copper foil, for example, the black oxidized copper foil surface.

JP-A No. 2002-225207 states that when a multi-layer film composed of 4-methyl-1-pentene copolymer and polyethylene or polypropylene is drawn, drawing unevenness and tear are less caused so as to yield a drawn film suitable for a release film, for producing an MLB, having high rigidity. However, if the hot pressing temperature is high at the time of the production of the MLB, the release film gets into the through-hole portions of the MLB so that the film deforms. Thus, this release film has a problem that the flatness of the film is not kept after the film is released.

JP-A No. 2003-1772 states that a multi-layer film composed of 4-methyl-1-pentene copolymer and polyethylene or polypropylene to which an inorganic filler is added is suitable as a release film, for producing an MLB, having high rigidity.

JP-A No. 6-134948 discloses a technique of a biaxial orientation multi-layer film wherein polypropylene resin layers are laminated on both surfaces of a central layer which has a specific thickness range and is made of 4-methyl-1-pentene resin containing heat resistant silicone, and a technique of peeling the polypropylene resin layers so as to produce polypropylene films. However, this technique is a technique for producing polypropylene thin films suitable for electrical condensers. Thus, this publication does not disclose any 4-methyl-1-pentene resin film having good releasability, which is suitable for release films. The biaxial orientation film made of the 4-methyl-1-pentene resin, which is obtained together with the polypropylene film by the present technique, cannot have a thermal coefficient of contraction of 20% or more, thin thickness unevenness and a good external appearance. Furthermore, the film is too weak in strength to be used as a release film since the film has a thin thickness. When the film is torn and broken, the film remains on the release surface. The film has problems about the releasability thereof from the roughened copper foil surface, for example, the black oxidized copper foil surface.

DISCLOSURE OF THE INVENTION

A first aspect of the present invention provides a drawn film having, as at least one outermost layer thereof, a layer (A) which comprises a copolymer that is made from 4-methyl-1-pentene and ethylene or an α-olefin, except 4-methyl-1-pentene having 3 to 20 carbon atoms and that comprises 80% or more by mole of 4-methyl-1-pentene and which does not substantially comprise wax or organic silicone compound, the peel area of the film being 50% or more when the film, together with a copper foil surface subjected to roughening treatment, is subjected to heating and pressing treatment.

A second aspect of the present invention provides a drawn film having, as at least one outermost layer thereof, a layer (A) comprising a copolymer that is made from 4-methyl-1-pentene and ethylene or an α-olefin, except 4-methyl-1-pentene, having 3 to 20 carbon atoms and that comprises 80% or more by mole of 4-methyl-1-pentene, the thermal coefficient of contraction of the film being 20% or more along the direction in which the film is drawn.

A third aspect of the present invention provides a film which is obtained by drawing a multi-layer film composed of a layer (A) comprising a copolymer that is made from 4-methyl-1-pentene and ethylene or an α-olefin, except 4-methyl-1-pentene, having 3 to 20 carbon atoms and that comprises 80% or more by mole of 4-methyl-1-pentene, and a layer (B) laminated on the layer (A) to contact the layer (A) and comprising a different thermoplastic resin, and then peeling the layers (A) and (B) from each other; and which has, as at least one outermost layer thereof, the layer (A) obtained after the peeling.

An embodiment of the present invention provides the above-mentioned film obtained after peeling the multi-layer film in which the layers (A) and (B) can be peeled from each other at a peel strength of 500 g/15 mm or less (measured at 23° C. and a speed of 300 mm/minute in a T-shaped peel state on the basis of JIS K6854).

A fourth aspect of the present invention provides a process for producing a drawn film, comprising the step of drawing a sheet composed of at least one outermost layer made of a layer (A) which comprises a copolymer that is made from 4-methyl-1-pentene and ethylene or an α-olefin, except 4-methyl-1-pentene, having 3 to 20 carbon atoms and that comprises 80% or more by mole of 4-methyl-1-pentene and which does not substantially comprise wax or organic silicone compound, and a layer (B) which is formed on the layer (A) and comprises a different thermoplastic resin; and the step of peeling the layer (B) from the other portions.

BEST MODES FOR CARRYING OUT THE INVENTION

The following describes the drawn film of the present invention which has, as at least one outermost layer thereof, a layer (A) comprising a copolymer that is made from 4-methyl-1-pentene and ethylene or an α-olefin, except 4-methyl-1-pentene, having 3 to 20 carbon atoms, and which does not substantially comprise wax or organic silicone compound, the peel area of the film from a copper foil surface subjected to roughening treatment being 50% or more, or the thermal coefficient of contraction of the film being 20% or more along the direction in which the film is drawn;

Further, the following describes the film which is obtained by drawing a multi-layer film composed of a layer (A) comprising a copolymer that is made from 4-methyl-1-pentene, and ethylene or an α-olefin, except 4-methyl-1-pentene, having 3 to 20 carbon atoms, and a layer (B) laminated on the layer (A) to contact the layer (A) and comprising a different thermoplastic resin, and then peeling the layers (A) and (B) from each other; and which has, as at least one outermost layer thereof, the layer (A) obtained after the peeling; and a superior process for producing the film.

4-Methyl-1-pentene copolymer (a) which constitutes a layer (A) comprising a copolymer that is made from 4-methyl-1-pentene and ethylene or an α-olefin, except 4-methyl-1-pentene, having 3 to 20 carbon atoms in the present invention is a copolymer made from 4-methyl-1-pentene and ethylene or an α-olefin, except 4-methyl-1-pentene, having 3 to 20 carbon atoms, preferably 7 to 20, more preferably 8 to 20.

Examples of ethylene or the α-olefin having 3 to 20 carbon atoms except 4-methyl-1-pentene include ethylene, propylene, 1-butene, 1-hexene, 1-heptene, 1-octene, 1-decene, 1-dodecene, 1-tetradecene, 1-hexadecene, 1-heptadecene, 1-octadecene, and 1-eicosene. Preferable are 1-decene, 1-dodecene, 1-tetradecene, 1-hexadecene, 1-heptadecene, and 1-octadecene. These α-olefins except 4-methyl-1-pentene may be used alone or in combination of two or more thereof. Of these olefins, 1-decene, 1-dodecene and 1-tetradecene are more preferable since they are good in rigidity and elastic modulus.

The 4-methyl-1-pentene copolymer (a) comprises recurring units induced from 4-methyl-1-pentene usually at a ratio of 80% or more by mole, preferably at a ratio of 90 to 98% by mole, more preferably at a ratio of 93 to 98% by mole, and comprises recurring units induced from the α-olefin usually at a ratio of 20% or less by mole, preferably at a ratio of 2 to 10% by mole, more preferably at a ratio of 2 to 7% by mole. When the content by percentage of the recurring units induced from ethylene or the α-olefin having 3 to 20 carbon atoms except 4-methyl-1-pentene is within the above-mentioned range, the 4-methyl-1-pentene copolymer (a) is excellent in film-formability and rigidity.

About the 4-methyl-1-pentene copolymer (a), the melt flow rate (MFR) thereof, measured according to ASTM D1238 at a load of 5.0 kg and a temperature of 260° C., is usually from 0.5 to 250 g/10 minutes, preferably from 1 to 150 g/10 minutes. When the MFR is within this range, the 4-methyl-1-pentene copolymer (a) is excellent in film-formability and mechanical strength property.

This 4-methyl-1-pentene copolymer (a) can be produced by a method which has been known so far. For example, the copolymer (a) can be obtained by polymerizing 4-methyl-1-pentene and the above-mentioned α-olefin in the presence of a catalyst, as described in JP-A No. 59-206418.

It is allowable to incorporate, into this 4-methyl-1-pentene copolymer (a), known additives which may be ordinarily incorporated into polyolefin, such as a heat-resistant stabilizer, a weather-resistant stabilizer, a hydrochloric acid absorber, a copper-damage preventive, an antistatic agent, and a lubricant, as far as the attainment of the objects of the present invention is not damaged.

Specific examples of the additive are as follows.

Examples of the phenolic antioxidant include phenolic compounds such as 2,6-di-tert-butyl-p-cresol and stearyl (3,3-dimethyl-4-hydroxybenzyl)thioglycolate, and polyphenolic carbonic acid oligo esters such as carbonic acid oligo esters (polymerization degree: e.g., 2, 3, 4, 5, 6, 7, 8, 9, or 10) of 4,4'-butylidenebis(2-tert-butyl-5-methylphenol).

Examples of the sulfur-based antioxidant include dialkyl thiodipropionate, and examples of the phosphorus-based antioxidant include triphenyl phosphate.

Examples of the hydrochloric acid absorber include compounds represented by the general formula:

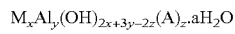

wherein M represents Mg, Ca or Zn, A represents an anion other than a hydroxyl group, x, y and z are each a positive number, a is 0 or a positive number.

Examples of the light stabilizer include 2-hydroxyl-4-methoxybenzophenone.

Examples of the lubricant include calcium stearate.

Such additives can be usually used at an amount of 0.0001 to 10 parts by weight for 100 parts by weight of the 4-methyl-1-pentene copolymer (a).

In the case that the film of the present invention is used particularly as a release film, impurities contained in the film precipitate onto a surface of the film since the film is exposed to high temperature and high pressure. Thus, when the film is pressed, the impurities may be transferred onto a surface of an MLB product or a different product which contacts the film so as to precipitate on this surface. This precipitation may cause poorness in the adhesion, electric conduction and external appearance of the MLB product or the different product. It is therefore preferable that the amount of the impurities is as small as possible. Thus, the amount of organic compounds except the 4-methyl-1-pentene copolymer (a) is preferably 0.5% or less, more preferably 0.1% or less, even more preferably 0.05% by mass. It is particularly preferable that the layer (A) does not substantially contain wax or organic silicone compound. The wording "the layer (A) does not substantially contain wax or organic silicone compound" means that neither wax nor organic silicone compound is positively added to the layer (A). The total amount thereof is less than 0.01%, preferably from 0.0001 to 0.01% (not inclusive) by mass.

[Components which Constitute the Layer (B) Comprising a Different Thermoplastic Resin]

The different thermoplastic resin layer (B) in the present invention is an olefin resin comprising ethylene or an α-olefin having 3 to 20 carbon atoms. Examples thereof include homopolymers made from ethylene or an α-olefin having 3 to 8 carbon atoms such as propylene, butene-1, pentene-1, hexane-1 or octene-1; and copolymers made from these olefins or one or more out of the olefins and a different monomer. Of these examples, polypropylene (b1) and polyethylene (b2), each of which also means a copolymer thereof and has a large thermal coefficient of contraction, are preferable since they make it possible to lower the strength of the layer (B) when the layers (A) and (B) are peeled from each other and make the draw ratio high. The polypropylene (b1) is more preferable since drawing conditions can widely be set and the film can easily be drawn.

The polypropylene (b1) used in the present invention is a homopolymer of propylene or a copolymer made from propylene and at least one selected from ethylene or α-olefins having 4 to 20 carbon atoms (preferably 4 to 10 carbon atoms) except propylene.

Examples of ethylene or the α-olefins having 4 to 20 carbon atoms except propylene include ethylene, 1-butene, 1-pentene, 1-hexene, 4-methyl-1-pentene, 1-octene, 1-decene, and mixtures thereof.

In the polypropylene (b1), the mole ratio of propylene to ethylene or the α-olefin having 4 to 20 carbon atoms except propylene (i.e., the mol number of propylene/that of ethylene or the α-olefin (except propylene)), which varies dependently on the kind of the α-olefin, is generally from 100/0 to 90/10, preferably from 100/0 to 95/5.

About the polypropylene (b1), the melt flow rate (MFR) thereof at 230° C. and a load of 2.16 kg is desirably from 0.1 to 100 g/10 minutes, more desirably from 0.5 to 50 g/10 minutes, and the density thereof is desirably more than 0.900 g/cm$^3$, more desirably from 0.900 g/cm$^3$ (not inclusive) to 0.920 g/cm$^3$ (inclusive).

The polyethylene (b2) used in the present invention is a homopolymer of ethylene or a copolymer made from ethylene and an α-olefin having 3 to 20 carbon atoms.

Examples of the α-olefin having 3 to 20 carbon atoms include propylene, 1-butene, 1-pentene, 1-hexene, 4-methyl-1-pentene, 1-octene, 1-decene, and mixtures thereof. Of the α-olefins, the α-olefins having 3 to 10 carbon atoms are particularly preferable.

In the polyethylene (b2), the mole ratio of ethylene to the α-olefin having 3 to 20 carbon atoms (i.e., the mol number of ethylene/that of the α-olefin), which varies dependently on the kind of the α-olefin, is generally from 100/0 to 99/1, preferably from 100/0 to 99.5/0.5.

About the polyethylene (b2), the melt flow rate (MFR) thereof at 190° C. and a load of 2.16 kg is desirably from 0.01 to 100 g/10 minutes, more desirably from 0.05 to 50 g/10 minutes, and the density thereof is desirably more than 0.900 g/cm$^3$, more desirably from 0.930 to 0.970 g/cm$^3$.

The polypropylene (b1) and the polyethylene (b2) can be produced by polymerizing the α-olefin with ethylene and propylene, respectively, in the presence of a catalyst in a known manner.

The polypropylene (b1) and the polyethylene (b2) may contain a component unit other than component units derived from the α-olefin, an example of the unit being a component unit derived from a diene compound, as far as characteristics of the polymers (b1) and (b2) are not damaged. The content by percentage of the diene component is usually from 0 to 1% by mole, preferably from 0 to 0.5% by mole.

[Multi-Layer Sheet]

In the case that a multi-layer sheet suitable for producing the drawn film of the present invention has, for example, three layers, the sheet is a sheet made of three layers having a structure of (B)/(A)/(B) wherein (A) represents a layer (a) comprising the above-mentioned 4-methyl-1-pentene copolymer (A) and (B) represents a layer comprising the polypropylene (b1) or the polyethylene (b2), that is, a structure wherein the layers (B) are formed on both surfaces of the layer (A).

In the case of forming a multi-layer film containing, as at least one outermost layer, a layer (A) obtained after the peeling of layers in the film, an adhesive resin layer (C) may be optionally interposed in a multi-layer sheet before the peeling. An example thereof is a multi-layer sheet (i.e., seven-layer sheet) having a structure of (B)/(A)/(C)/(D)/(C)/(A)/(B) wherein (C) represents the adhesive resin layer, and (D) represents a layer made of a thermoplastic resin having a melting point of 80 to 250° C., preferably from 120 to 250° C. The melting point is measured by DSC (differential scanning calorimetry). The resin for the layer (D) may be a known resin such as polyethylene, polypropylene, polyamide, or polyethylene terephthalate.

The adhesive resin layer (C) used in the present invention is any resin layer making it possible to adhere the layer (A) which comprises the 4-methyl-1-pentene copolymer (a), and the thermoplastic resin layer (D) to each other. A preferable example of the adhesive resin layer (C) used in the present invention is an adhesive resin composition composed of a homopolymer of 4-methyl-1-pentene or a copolymer made from 4-methyl-1-pentene and ethylene or an α-olefin having 3 to 20 carbon atoms except 4-methyl-1-pentene, and poly 1-butene.

When the adhesive resin layer (C) is made of an adhesive resin composition having a composition as described above, the layer (A) and the layer (D) can be strongly adhered to each other.

Of these sheets, the three-layer sheet having the structure of (B)/(A)/(B) is preferable since the sheet can be effectively produced by use of simple equipment.

Examples of the process for producing such a multi-layer sheet include a process of coextrusion-molding the 4-methyl-1-pentene copolymer (a) and the polypropylene (b1) or the polyethylene (b2), and a process of press-molding sheets formed from the respective resins beforehand by press molding, extrusion molding or some other method, so as to be made into a laminated sheet. In the case of the above-mentioned three-layer sheet, the coextrusion molding is particularly preferable since the sheet can be effectively produced.

By such a process, the three-layer sheet wherein the layers (B) are laminated on both surfaces of the layer (A) can be obtained. The above-mentioned seven-layer sheet can also be produced by a similar process.

By making the material of the layer (B) of the multi-layer sheet having the above-mentioned structure to the polypropylene (b1) or polyethylene (b2), it is possible to set the peel strength of the drawn film between the layers (A) and (B) in the multi-layer sheet (for example, (B)/(A) or (A)/(B) in the case of the three-layer sheet, and (B)/(A) or (A)/(B) in the case of the seven-layer sheet) of the drawn film to 500 g/15 mm or less, and also make the appearance of the film obtained by peeling between the layers good.

[Drawing of the Multi-Layer Sheet]

The resultant multi-layer sheet can be drawn by a method known in the prior art, such as a tubular method and a tenter method. For example, in the case that the three-layer sheet is drawn, the heating temperature for the drawing is from 120 to 210° C., preferably from 130 to 180° C., and the draw ratio is usually from 5 to 20 times, preferably from 6 to 15 times, more preferably from 7 to 10 times in order to make the thermal coefficient of contraction of the film obtained after peeling into a 20% or more, and make the peel area of the film from a copper foil surface subjected to roughening treatment into 50% or more.

The method for the drawing can be appropriately adopted from methods known in the prior art, as described above. Monoaxial drawing is particularly preferable since the thickness unevenness of the drawn film can be reduced and the draw ratio can be made high.

In order to prevent natural contraction of the drawn film when the film is stored, the multi-layer may be subjected to annealing treatment at a temperature lower than the melting point of the resins as far as the thermal coefficient of contraction is not below 20%.

The thickness of the multi-layer sheet can be adjusted on the basis of the thickness of the film obtained after peeling and the draw ratio. The thickness, which is not particularly limited, is usually from 10 μm to 10 mm, preferably from 10 μm to 8 mm, more preferably from 10 μm to 4 mm. Naturally, the sheet molding and the drawing can be continuously performed by means of a single machine. Such a machine is commercially available.

[Film of the Present Invention]

The film of the present invention is a film which is obtained by drawing the multi-layer sheet comprising the layer (A) and the layer (B) laminated on the layer (A) to contact the layer (A), and subsequently peeling the layers (A) and (B) from each other, and which has, as atone least one outermost layer thereof, the layer (A) obtained after the peeling. The film of the present invention obtained after the peeling is a mono-layer film made of the layer (A) or a multi-layer film comprising the layer (A). In the case of the multi-layer film, one of the outermost layers is the layer (A) obtained after the peeling or both of the outermost layers are the layers (A) obtained after the peeling. In the case that one of the outermost layers is the layer (A) obtained after the peeling, the other outermost layer is preferably a layer made of an olefin resin comprising ethylene or an α-olefin having 3 to 20 carbon atoms. Of these films, the mono-layer film made of the layer (A) is preferable since the film has a good external appearance and can be reused by molding the used film again.

If in the film of the present invention obtained after the peeling the layer (A) has a thin thickness, the film is too weak in strength to be used as a release film. Moreover, at the time of the peeling, the film is torn and broken to remain easily on the peel surface. If the thickness is thick, the film does not deform easily when the film is released. Accordingly, the load for the release becomes large. At its worst, the MLB product or like deforms. The thickness of the film of the present invention obtained after the peeling is usually from 10 to 500 μm, preferably from 20 to 300 μm, more preferably from 25 to 200 μm.

The film of the present invention can be obtained by producing the film as described above. According to the above-mentioned method, it is possible to obtain the film of the present invention, which is obtained by drawing a multi-layer sheet and then peeling layers therein from each other, having a thermal coefficient of contraction of 20 to 40%. This film has a feature that when the film is overlapped on a copper foil surface subjected to roughening treatment and then the resultant is hot-pressed, the peel area of the film from the copper foil surface is 50% or more. In the case that the conditions for the production are optimized, it is possible to obtain a film having good characteristics preferable for a release film. The characteristics are as follows: the thermal coefficient of contraction: 25 to 35%, preferably 26 to 30%; the elastic modulus: 60 MPa or more; and the peel area of the film from the copper foil surface: 60 to 100%, preferably 65 to 100%, more preferably 70 to 100%.

In the present invention, the thermal coefficient of contraction is the ratio of the length of the film of the invention when the film is heated and contracted to the original length thereof before the heating, and is a value obtained by measuring the length L1 of the film along the film-drawn direction at room temperature before the heating and the length L2 corresponding to the length L1 after 30 minutes from the time when the film is allowed to stand still at 180° C. for 30 minutes and then cooled to room temperature; and calculating the following equation (1) using the measured values:

$$\text{Thermal coefficient (\%) of contraction} = (L1-L2)/L1 \times 100 \quad (1)$$

wherein L1 represents the length (cm) of the length in the film-drawn direction before the heating, and L2 represents the length (cm) of the length in the film-drawn direction after the heating.

In the present invention, the peel area is the film area which can be peeled at the time of overlapping the film of the invention on a copper foil having roughened surfaces, sandwiching the resultant between metal plates with cushions, pressing the sandwich by means of a press at 185° C. and 36 kg/cm$^2$ for 30 minutes, cooling the sandwich to 25° C., and picking up one end of the film, and peeling the film continuously at a rate of 100 mm/minute and a peel angle of 90°, the peel angle being an angle between the roughened copper foil and the film. In light of the objects of the present invention, a better result can be obtained as the peel area is larger.

The film of the present invention obtained after the peeling has high rigidity and high heat resistance, and is used as any one of various wrapping films such as a food-wrapping film, a medicine-wrapping film, and a wrapping film for keeping freshness. The film is particularly suitable as a release film which has good releasability from a copper foil surface subjected to roughening treatment, such as a black oxidized copper foil surface, and is suitable for producing an MLB.

EXAMPLES

The present invention is specifically described by way of the following examples. However, the present invention is not limited to the examples.

In the examples and comparative examples, the following were used as 4-methyl-1-pentene copolymer, polypropylene, and a copper foil having roughened surfaces.

4-Methyl-1-pentene copolymer (a)

Copolymer made from 4-methyl-1-pentene and 1-decene. The content of 4-methyl-1-pentene in this copolymer was 97% by mole, and the content of 1-decene therein was 3% by mole. The MFR thereof, which was measured according to ASTM D1238 at a load of 5.0 kg and a temperature of 260° C., was 12 g/10 minutes.

Polypropylene (b1)

Trade name: F-122, manufactured by GRAND POLYMER Co., Ltd. The density thereof was 0.91 g/cm$^3$, and the MFR thereof, which was measured according to ASTM D1238 at a load of 2.16 kg and a temperature of 230° C., was 2 g/10 minutes.

(A Copper Foil Having Roughened Surfaces)

Surfaces of a copper foil were etched with a hydrogen peroxide/sulfuric acid based etching solution (trade name: Ebachem Neo Brown, manufactured by EBARA DENSAN LTD.) to yield a copper foil having roughened surfaces. The roughened surfaces of the copper foil were measured with a non-contact three-dimension microsurface observation system NT-2000 (manufactured by WYKO). About the surface roughness of the foil, the Ra thereof was from 0.27 to 0.34 μm, and the Rt thereof was from 2.01 to 2.22 μm.

Example 1

A T-die extrusion molding machine for three layers made of materials of two kinds, manufactured by Sumitomo heavy industries modern Ltd., was used to coextrusion-mold the 4-methyl-1-pentene copolymer (a) (cylinder temperature: 290° C.) for forming an intermediate layer and the polypropylene (b1) (cylinder temperature: 240° C.) for forming outer layers at a dice temperature of 270° C., so as to yield a non-drawn sheet wherein the thickness of each of the polypropylene layers was 50 μm and that of the poly-4-methyl-1-pentene layer was 200 μm.

The non-drawn sheet was cut into a piece 7 cm square, and the piece was monoaxially drawn 5 times at a temperature of 150° C. Thereafter, the polypropylene layers at both surface sides of the piece were peeled. The peel strength was 100 g/15 mm or less.

Next, the resultant drawn film made of the 4-methyl-1-pentene layer was cut into a piece 6 cm in length and 12 cm in width. The copper foil having the roughened surfaces was cut into a piece 5 cm in length and 10 cm in width. The foil piece was overlapped on the film piece. The resultant was sandwiched between two metal plates having a surface roughness of 6S with cushion materials, and heated and pressed using a hot press at 185° C. and 36 kg/cm$^2$ for 30 minutes in such a manner that both ends of the film would not pressed by 1 cm. Next, the lamination was taken out from the press and then cooled to 25° C. Thereafter, one of the ends of the film was picked up, and the film was continuously peeled from the foil at a rate of 100 mm/minute and a peel angle of 90°, the peel angle being an angle between the roughened copper foil and the film. The end of the film and the end of the roughened copper foil surface were peeled from each other into a T-shaped form. The roughened copper foil surface was divided into 100 equal crosses and the number of the equal crosses where the film was peeled was counted to obtain the peel area of the film from the roughened foil surface. If the film was completely peeled from the copper foil surface, the result was defined as 100%. If the film was not peeled at all, the result was defined as 0%.

The external appearance of the film was observed with the naked eye, and the result was evaluated on the following criterion:

Good: unevenness was hardly observed in the film external appearance; and

Bad: unevenness was observed in the film external appearance. The results are shown in Table 1.

The resultant film was cut by a length of 15 cm in the film-drawn direction (MD direction) and cut by a length of 2 cm in the perpendicular direction (TD direction). The length L1 of the film in the MD direction was measured at room temperature. Next, the cut film was allowed to stand still in a thermostat having a temperature of 185° C. for 30 minutes. Thereafter, the film was cooled to room temperature. After 30 minutes, the length L2 corresponding to the length L1 was measured, and then the thermal coefficient of contraction of the film was calculated in accordance with the following equation:

$$\text{Thermal coefficient (\%) of contraction} = (L1-L2)/L1 \times 100 \quad (1)$$

wherein L1 represents the length (cm) of the length in the film-drawn direction before the heating, and L2 represents the length (cm) of the length in the film-drawn direction after the heating.

A solid viscoelasticity meter (RSA-II, manufactured by Rheometric Scientific Inc. Co.) was used to measure the elastic modulus of the resultant film in the MD direction at a frequency of 2 Hz while the temperature of the film was raised from 40 to 200° C. at a rate of 5° C./minute. The storage elastic modulus thereof at 185° C. was defined as the elastic modulus.

Example 2

The same operations as in Example 1 were carried out except that the draw ratio was set to 6 times. The results are shown in Table 1.

Example 3

The same operations as in Example 1 were carried out except that the draw ratio was set to 7 times. The results are shown in Table 1.

Example 4

The same operations as in Example 1 were carried out except that the draw ratio was set to 8 times. The results are shown in Table 1.

Example 5

The same operations as in Example 1 were carried out except that the draw ratio was set to 4.3 times. The results are shown in Table 1.

Comparative Example 1

An adhesive resin (c) was used between respective layers of the 4-methyl-1-pentene copolymer (a)/the polypropylene (b1)/the 4-methyl-1-pentene copolymer (a), and then this was subjected to extrusion molding in such a manner that the layers would have thicknesses of 80 μm, 40 μm, and 80 μm, respectively. The resultant multi-layer sheet was drawn 4 times at 180° C. by the same operation as in Example 1, and subsequently the peel area of the film from the roughened copper foil was measured without peeling the layers from each other. The results are shown in Table 1.

Adhesive resin (c): a mixture obtained by mixing 40 parts by mass of a 4-methyl-1-pentene copolymer (the content of 1-octadecene: 6% by mass, MFR: 3.0 g/10 minutes), 40 parts by mass of a 1-butene copolymer (the content of ethylene: 5% by mass, MFR: 2.5 g/10 minutes), 0.01 part by mass of Irganox 1010 (trade name), manufactured by Ciba Specialty Chemicals K. K., and 0.03 part by mass of calcium stearate (manufactured by Sankyo Organic Chemicals Co., Ltd.), in a Henschel mixer, at a low rotating-speed for 3 minutes, and then extruding the mixture by means of a biaxial extruder at a temperature of 280° C.

Comparative Example 2

The same operations as in Comparative Example 1 were carried out except that a monolayer sheet of 200 μm thickness made of the 4-methyl-1-pentene copolymer wherein the polypropylene layer and the adhesive resin layer were removed was drawn 4 times. The results are shown in Table 1.

Comparative Example 3

The same operations as in Comparative Example 2 were carried out except that a monolayer sheet of 250 μm thickness made of the 4-methyl-1-pentene copolymer was drawn 5 times. The external appearance of the result film was poor. The results are shown in Table 1 high heat resistance. The film is suitable as a release film which is suitable for producing an MLB and has a good releasability from a copper foil surface subjected to roughening treatment, such as a black oxidized copper foil surface, and has a very high industrial value.

The invention claimed is:

1. A drawn film which is a single layer film of a layer (A) that is obtained by monoaxial drawing a three-layer sheet having the structure of (B)/(A)/(B) from 7 to 10 times, and subsequently peeling the layers (A) and (B) from each other, the layer (A) comprising a copolymer that is made from 4-methyl-1-pentene and at least one comonomer of ethylene or an α-olefin having 3 to 20 carbon atoms with the proviso that the α-olefin is not 4-methyl-1-pentene, wherein the copolymer comprises 80% or more by mole of 4-methyl-1-pentene units and said layer does not substantially comprise wax or organic silicone compound, wherein the peel area of the film is from 70 to 100% wherein the peel area is determined by overlapping layer (A) on a copper foil having roughened surfaces, placing the drawn film and copper foil between metal plates with cushions, pressing by means of a press at 185° C. and 36 kg/cm² for 30 minutes, cooling to 25° C., and picking up one end of the film, and peeling the film continuously at a rate of 100 mm/minute and a peel angle of 90°, the peel angle being an angle between the roughened copper foil and the film; and the thermal coefficient of contraction of the film is from 26 to 30% along the direction in which is the film is drawn.

2. A release film, which is the drawn film according to claim 1.

3. A drawn film according to claim 1, obtained by drawing a multi-layer sheet comprising the layer (A) and (B) layers which are formed on the layer (A) and comprise polypropylene and/or polyethylene, to give a drawn multi-layer film having a peel strength between the layer (A) and (B) layers of 500 g/15 mm or less, wherein the peel strength is measured at 23° C. and a speed of 300 mm/minute in a T-shaped peel state on the basis of JIS K6854.

TABLE 1

|  | UNIT | EXAMPLE 1 | EXAMPLE 2 | EXAMPLE 3 | EXAMPLE 4 | EXAMPLE 5 | COMPARATIVE EXAMPLE 1 | COMPARATIVE EXAMPLE 2 | COMPARATIVE EXAMPLE 3 |
|---|---|---|---|---|---|---|---|---|---|
| PEEL STRENGTH | g/15 cm | 100 OR LESS | 100 OR LESS | 100 OR LESS | 100 OR LESS | 100 OR LESS | — | — | — |
| DRAW RATIO | % | 5 | 6 | 7 | 8 | 4.3 | 4 | 4 | 5 |
| DRAWING | — | ABLE TO BE DONE | ABLE TO BE DONE | ABLE TO BE DONE | ABLE TO BE DONE | ABLE TO BE DONE | ABLE TO BE DONE | ABLE TO BE DONE | ABLE TO BE DONE |
| PEEL AREA | % | 60 | 65 | 70 | 80 | 50 | 30 | 20 | 25 |
| EXTERNAL APPEARANCE | — | GOOD | GOOD | GOOD | GOOD | GOOD | POOR | POOR | POOR |
| COEFFICIENT OF CONTRACTION | % | 22 | 25 | 26 | 28 | 20 | 18 | 15 | 18 |
| ELASTIC MODULUS | Mpa | 66 | 70 | 72 | 74 | 64 | 63 | — | — |
| THICKNESS OF THE LAYER (A) AFTER DRAWING | μm | 40 | 35 | 28 | 25 | 47 | 50*1 | 50 | 50 |

7: *1The thickness of the multi-layer film after it was drawn.

INDUSTRIAL APPLICABILITY

The film of the present invention, which has a further improved releasability and is suitable as a release film, has high rigidity, good precision in the thickness thereof, and 4. A process for producing a drawn film comprising a layer (A), comprising the step of drawing a three-layer sheet having the structure of (B)/(A)/(B), from 7 to 10 times, wherein the (B) layers are formed on the layer (A), wherein the layer (A) comprises a copolymer that is made from 4-methyl-1-pentene and at least one comonomer of ethylene or an α-olefin, except 4-methyl-1-pentene, having 3 to 20 carbon atoms and that comprises 80% or more by mole of 4-methyl-1-pentene units and said layer (A) does not substantially comprise wax or organic silicone compound, and the (B) layers comprise polypropylene and/or polyethylene; and the step of peeling the (B) layers from the layer (A).

* * * * *